United States Patent
Reist et al.

(10) Patent No.: US 9,466,551 B1
(45) Date of Patent: Oct. 11, 2016

(54) HEAT TRANSFERRING CLAMP

(75) Inventors: Daniel T. Reist, Mountville, PA (US); Scott D. Garner, Lititz, PA (US); Jens E. Weyant, Hershey, PA (US); E. Michael Ames, Strasburg, PA (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 761 days.

(21) Appl. No.: 13/385,235

(22) Filed: Feb. 9, 2012

(51) Int. Cl.
F28F 11/06 (2006.01)
F28D 15/00 (2006.01)
H01L 23/473 (2006.01)
F28D 15/02 (2006.01)

(52) U.S. Cl.
CPC ......... H01L 23/473 (2013.01); F28D 15/0241 (2013.01)

(58) Field of Classification Search
CPC ............... H01L 23/467; H01L 23/473; H01L 2023/4075; H01L 2023/4081; H01L 2023/4087; F28D 15/0241; F28D 15/0275; F28D 15/04
USPC ........ 165/80.2, 80.4, 104.21, 104.26, 104.33
See application file for complete search history.

(56) References Cited

U.S. PATENT DOCUMENTS

| | | | | |
|---|---|---|---|---|
| 3,820,592 A * | 6/1974 | Lander | ................ | H01L 23/4006 165/185 |
| 4,480,287 A * | 10/1984 | Jensen | ................. | H05K 7/1404 361/707 |
| 4,971,570 A * | 11/1990 | Tolle | .................... | H05K 7/1404 361/709 |
| 5,218,517 A * | 6/1993 | Sewell | ............... | H05K 7/20445 174/16.3 |
| 5,382,175 A * | 1/1995 | Kunkel | ................ | H05K 7/1404 29/525.09 |
| 5,472,353 A * | 12/1995 | Hristake | ............. | H05K 7/1404 361/709 |
| 5,949,650 A | 9/1999 | Bulante | | |
| 6,839,235 B2 | 1/2005 | St. Louis | | |
| 7,117,930 B2 * | 10/2006 | Todd et al. | ............. | 165/104.21 |
| 7,327,576 B2 * | 2/2008 | Lee | ..................... | F28D 15/0275 165/80.4 |
| 7,411,791 B2 * | 8/2008 | Chang | ................. | F28D 15/0266 165/104.33 |
| 7,515,423 B2 * | 4/2009 | Peng et al. | .................... | 361/710 |
| 8,456,846 B2 * | 6/2013 | Mosier | ...................... | F16B 2/14 361/728 |
| 8,780,556 B1 * | 7/2014 | Ditri | .................... | H05K 7/1404 165/80.2 |
| 2011/0088874 A1 * | 4/2011 | Meyer, IV | ........... | F28D 15/046 165/104.26 |
| 2011/0182033 A1 | 7/2011 | Tissot | | |
| 2011/0220328 A1 * | 9/2011 | Huang | ............... | F28D 15/0241 165/104.26 |

\* cited by examiner

*Primary Examiner* — Len Tran
*Assistant Examiner* — Claire Rojohn, III
(74) *Attorney, Agent, or Firm* — McNees Wallace & Nurick LLC

(57) ABSTRACT

The apparatus is a heat transferring clamp with a heat pipe connecting the clamp's stationary base part to each moveable clamping part. A connecting heat pipe section between the heat pipe sections in the base part and each clamping part is flexible enough to permit both the required clamping and unclamping movements of the clamping part. The heat pipes thereby provide a superior heat transfer path between a clamped circuit board or other device and an available heat sink.

10 Claims, 2 Drawing Sheets

HEAT TRANSFERRING CLAMP

BACKGROUND OF THE INVENTION

This invention deals generally with mechanical clamping devices for mounting electronic circuit boards within a chassis, but it is suitable in any other situation which requires a clamping device with excellent heat transfer capability. It is common to use a chassis that has parallel guide channels so that individual circuit boards can slide into the channels and be connected to the appropriate electric connectors when located in the channels. It is therefore necessary to clamp the circuit boards in place to prevent disturbing the electrical connections, and the almost universal device for mechanical clamping is known as the wedgelock clamp.

The main benefit of a wedgelock clamp is that it provides a consistent clamp force along its entire length while only requiring physical access from one end. The clamp is typically loosened and tightened by means of a hex head machine screw. A typical chassis receptacle for a circuit board has channels at the top and bottom of the receptacle. The circuit card assembly is comprised of a circuit board (often mounted to a heat spreader) with wedge lock clamps attached to its face near the top and bottom edges. The assembly is then slid into the chassis channels, and the clamps are tightened. The benefits of the wedgelock style clamp that make it appealing to designers is that it is lightweight, simple and easy to manufacture and assemble.

Another requirement for any circuit board clamp is to transfer the heat generated by the circuit board components to a heat sink for disposal. However, a problem with most of the conventional clamps is that the moveable mating parts provide poor heat transfer pathways for heat to move to the receptacle to which the circuit board is mated. Since the clamps are typically used to mount circuit boards which carry sensitive heat generating components, there is almost always a need to improve heat transfer from the circuit board to the device into which it is mounted. This is the only point of physical contact with the circuit board assembly, and it is therefore the logical source of heat transfer. Often the clamps are connected to heat spreaders which collect heat from the electronic components and are used to help with thermal management of the system. As the heat is conducted from the component to the heat sink, large temperature gradients occur at the circuit board clamp location, because the conductive surface contact area is dramatically reduced due to the separation of the moveable parts which interconnect the circuit board and the receptacle into which it is being installed. As electronic assemblies in general progress and the heat transfer requirements of edge cooled circuit boards increase, this restriction in heat transfer at the clamp will become more signficant as a weakness in the system.

The present invention overcomes the heat transfer limitation in the clamp, which is the weakest link in the heat transfer path.

SUMMARY OF THE INVENTION

The present invention is a superior heat transferring circuit board clamp which clamps the circuit board into a receptacle from which it is interconnected with the system electronics, and through which the heat generated by the circuit board components is transferred to a heat sink.

It is common to use a chassis that has receptacles that are parallel guide channels so that individual circuit boards can slide into the channels and be connected to the appropriate electric connectors when located in the channels. It is therefore necessary to clamp the circuit boards in place to prevent disturbing the electrical connections. The clamp typically has at least one base part that applies force to the heat source and at least one moveable clamping part that applies force to the receptacle. A typical chassis receptacle for a circuit board has channels at the top and bottom of the circuit board assembly, and there are clamps attached to the top and bottom of the circuit board. The circuit board then slides into the chassis channels, and the clamps are tightened. However, in some cases the clamps are installed in the circuit board receptacle and the same clamping action takes place when the circuit board is slid in.

Another requirement for any circuit board clamp is to transfer the heat generated by the circuit board components to the chassis, from which the heat is transferred to a heat sink for disposal. Regardless of the specific design of the clamp, it has at least one base part that is attached to or applies force to the circuit board and at least one moveable clamping part that applies force to a connection to a heat path to the heat sink. The base part is usually in contact with the heat source through the circuit board, and the clamping part moves away from the base part to press against the receptacle and clamp the board in place. This action means that there is at least some space created between the two parts of the clamp when the circuit board is clamped in place. That space and the limited heat conductivity of the base part and clamping part make the circuit board clamp a poor heat transfer path.

To overcome this limitation, in the present invention at least one connecting heat pipe is attached to the base part and to each moveable clamping part, and the connecting heat pipes are flexible enough to permit both the required clamping and releasing movements of the clamping part. Furthermore, additional heat pipes can also be installed within the clamp's base part and within each clamping part. The heat pipes thereby provide a superior heat transfer path between the clamped circuit board and an available heat sink because they surpass the mere conductivity of the clamp's parts and furnish heat pipes to transfer heat across the insulating separations between the parts.

DETAILED DESCRIPTION OF THE INVENTION

FIG. 1 is a cross section view of clamp 10 which is the preferred embodiment of the invention and is mounted in space A. Clamp 10 is constructed from three parts.

Figure 1A:
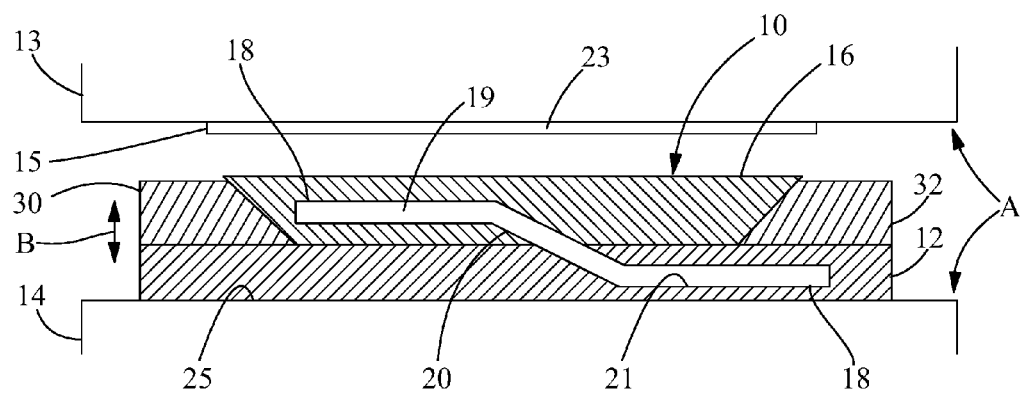
FIG. 1A is a cross section view of a clamp which includes the preferred embodiment of the invention, the clamp is shown in a relaxed state.
Figure 1B:
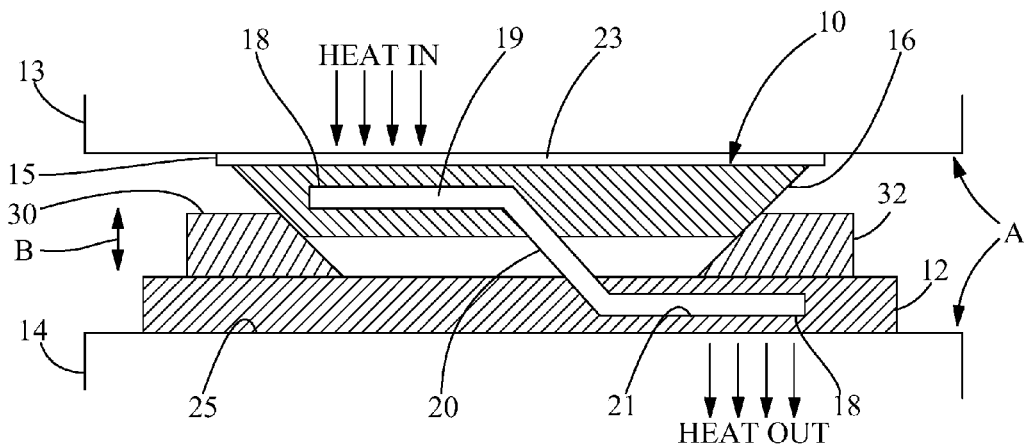
FIG. 1B is a cross section view of a clamp which includes the preferred embodiment of the invention, the clamp is shown in a clamped state.

The first parts are moveable clamping parts 16, 30, 32, the parts that apply force to lock clamp 10 in the fixed position. Base part 12 is shown in contact with chassis part 14 or some other structure that can act as a heat sink or a heat pathway to a heat sink. Clamping part 16 travels in path B from its clamping position shown in FIG. 1B in contact with chassis part 13 or circuit board 15 in which it locks clamp 10 and clamping part 16 to prevent them from moving, and then clamping part 16 moves into any location in which clamping part 16 is no longer in contact with any part such as chassis part 13 or circuit board 15 so that entire clamp 10 and circuit board or other clamped item 15 can move freely (FIG. 1A).

Clamping part 16 is the part that applies force to circuit board or other clamped item 15 or another heat generating component. In FIG. 1 clamping part 16 is shown in contact with or attached to circuit board or other clamped item 15 and thus shows clamp 10 in its expanded condition clamping circuit board or other clamped item 15 tightly against chassis part 13 and preventing movement of clamp 10 and circuit board or other clamped item 15.

It should be understood that the parts which base 12 and moveable clamping part 16 are contacting or attached to can be interchanged and it has no effect on the operation or benefit of the invention as long as one clamp part can be withdrawn from contact to permit withdrawal or circuit board or other clamped part 15. Under such circumstances, if clamping part 16 is permanently attached to circuit board or clamped item 15, clamp 10 and circuit board or clamped item 15 will move out of space A together.

The structure to impart motion to moveable clamping part 16 is not shown in any of the figures, but can be accomplished by various conventional means. For instance, in a wedgelock clamp, the clamping part is typically tightened and loosened by means of a machine screw that is turned to push one or more wedge shaped clamping parts 16 up a slope to separate it from the base 12, and the screw is reversed to bring the clamping part back toward the base and release the clamping force.

It is the third part of the invention, heat pipe 18, which gives clamp 10 its superior heat transfer qualities. Heat pipe 18 is attached to or integrated into both base 12 and clamping part 16, thus transferring heat between base 12 and clamping part 16 with virtually no heat resistance. In the typical application heat enters into clamping part 16 and is transferred to base 12 from which it moves into chassis part 14 and then to a heat sink for disposal.

Section 20 of heat pipe 18 is a key factor in the satisfactory operation of the present invention, because section 20 of heat pipe 18 tolerates flexing due to the movement of clamping part 16 away from and toward base 12 without problems. Section 20 can survive such flexing because the clamping movement B is quite small and because of its design geometry and material properties.

Heat pipe 18 is able to be connected to base 12 and clamping part 16 while still allowing relative movement between the two parts because heat pipe 18 functions as a spring. Heat pipe 18 can be flexed over a small distance without undue force or mechanical damage due to its design and ductility. This behavior is made possible by the material properties, heat treatment, and geometry. Standard cantilever beam design of heat pipe 18 allows it to meet the required overall deflection without exceeding stress and fatigue requirements. Ultimately heat pipe 18 must be designed to accommodate the necessary movements of clamp 10 from a relaxed state (FIG. 1A) to clamped state (FIG. 1B) without damaging the integrity of the envelope of heat pipe 18.

During manufacture heat pipe 18 can be annealed to a relatively soft state. Heat pipe 18 can also be constructed as a relatively flat structure rather than the more conventional cylindrical heat pipe, and that shape makes it even more suitable for the required flexing. Another example of a flexible design is a bellows used in the midsection of heat pipe 18 to provide the required flexibility.

Figure 2A:
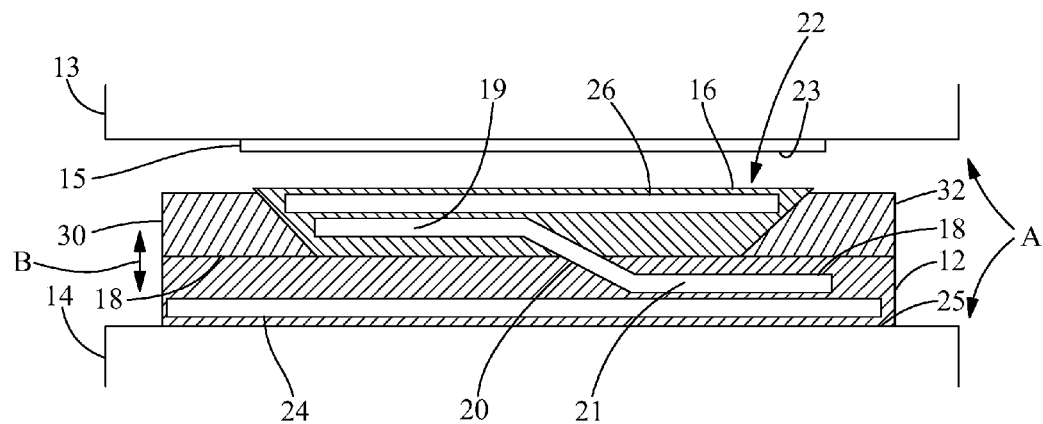
FIG. 2A is a cross section view of a clamp which includes an alternate embodiment of the invention, the clamp is shown in the relaxed state.
Figure 2B:
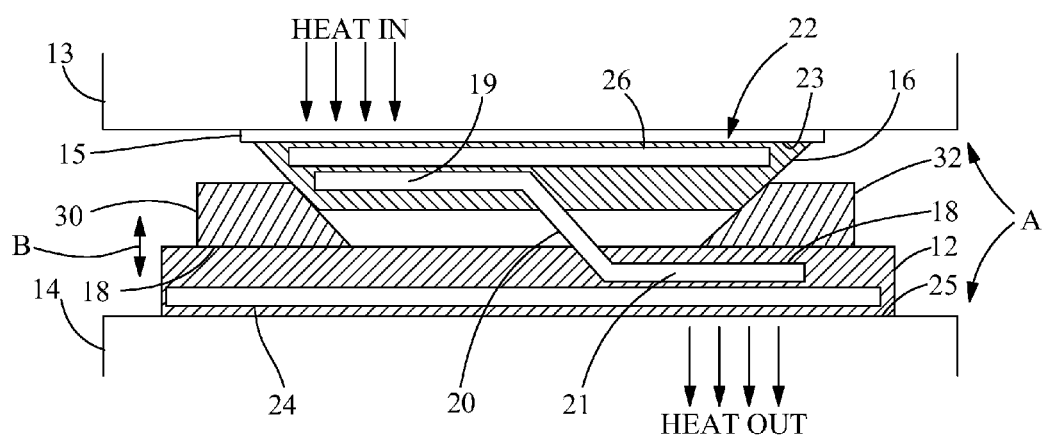
FIG. 2B is a cross section view of a clamp which includes an alternate embodiment of the invention, the clamp is shown in the clamped state.

FIGS. 2A and 2B are a cross section view of clamp 22 which includes an alternate embodiment of the invention. Essentially, clamp 22 includes the same component parts as clamp 10 of FIGS. 1A and 1B, but also has additional heat pipes 24 and 26 to aid in the distribution of heat throughout base 12 and clamping part 16. The use of such multiple heat pipes helps change the clamp from the poorest heat transfer component in the system to the very best.

It is to be understood that the form of this invention as shown are merely preferred embodiments. Various changes may be made in the function and arrangement of parts; equivalent means may be substituted for those illustrated and described; and certain features may be used independently from others without departing from the spirit and scope of the invention as defined in the following claims.

For example, Additional heat pipes may be added at any location on the base of the clamp or along any of the moving clamping parts. The heat pipes are held in thermal contact (solder, epoxy or mechanically) with the different clamp components. There is no limit to the number of heat pipes or their orientation between the moving components of the clamp. Typically the heat pipes will be nested together to maximize the amount of evaporator and condenser area of each heat pipe. The pipes may be bent, twisted or flattened in any orientation that is advantageous, and heat pipe variations such as thereto siphons or vapor chambers may be used in place of conventional heat pipes to accomplish the same results.

Furthermore, it should be understood that multiple installations such as those shown in FIG. 1 and FIG. 2 can be used on any clamp to accommodate to the clamp's size.

What is claimed as new and for which Letters Patent of the United States are desired to be secured is:

1. A heat transferring wedgelock clamp, the heat transferring clamp comprising:
    at least one base part with a heat transferring connection to a heat source when the heat transferring wedgelock clamp is in a clamped position;
    at least one wedged shaped clamping part moveable from a relaxed position, in which the at least one wedged shaped clamping part is provided proximate the at least one base part, to the clamped position, in which the at least one wedged shaped clamping part is separated from the at least one base part, the at least one wedged shaped clamping part with a heat transferring connection to a heat sink when the clamp is in the clamped position, the at least one wedged shaped clamping part applies a force to lock the heat transferring wedgelock clamp in the clamped position between the heat source and the heat sink; and
    at least one heat pipe with a first section attached to the at least one base part and a second section attached to the at least one wedge shaped clamping part and including a third flexible spring section that is flexible and permits the at least one wedge shaped clamping part to move relative to the at least one base part between the relaxed position and the clamped position, the third flexible spring section is flexed without exceeding stress and fatigue requirements as the heat transferring wedgelock clamp is moved to the clamped position.

2. The heat transferring clamp of claim 1 further including at least one additional heat pipe attached to the at least one wedge shaped clamping part to spread heat throughout the at least one wedge shaped clamping part.

3. The heat transferring clamp of claim 1 further including at least one additional heat pipe attached to the at least one base part to spread heat throughout the at least one base part.

4. The heat transferring clamp of claim 1 wherein the heat pipe is constructed as a thermo siphon.

5. The heat transferring clamp of claim 1 wherein the heat pipe is constructed as a vapor chamber.

6. A heat transferring wedgelock clamp comprising:
at least one base part with a heat transferring connection to a heat sink when the heat transferring wedgelock clamp is in a clamped position;
at least one wedged shaped clamping part moveable from a relaxed position, in which the at least one wedged shaped clamping part is provided proximate the at least one base part, to the clamped position, in which the at least one wedged shaped clamping part is separated from the at least one base part, the at least one wedged shaped clamping part with a heat transferring connection to a heat source when the clamp is in the clamped position, the at least one wedged shaped clamping part applies a force to lock the heat transferring wedgelock clamp in the clamped position between the heat source and the heat sink; and
at least one heat pipe with a first section attached to the at least one base part and a second section attached to the at least one wedge shaped clamping part and including a third flexible spring section that is flexible and permits the at least one wedge shaped clamping part to move relative to the at least one base part between the relaxed position and the clamped position, the third flexible spring section is flexed without exceeding stress and fatigue requirements as the heat transferring wedgelock clamp is moved to the clamped position.

7. The heat transferring clamp of claim 6 further including at least one additional heat pipe attached to the at least one wedge shaped clamping part to spread heat throughout the at least one wedge shaped clamping part.

8. The heat transferring clamp of claim 6 further including at least one additional heat pipe attached to the at least one base part to spread heat throughout the at least one base part.

9. The heat transferring clamp of claim 6 wherein the heat pipe is constructed as a thermo siphon.

10. The heat transferring clamp of claim 6 wherein the heat pipe is constructed as a vapor chamber.

* * * * *